(12) United States Patent
Shibata

(10) Patent No.: US 8,102,206 B2
(45) Date of Patent: Jan. 24, 2012

(54) MULTI-PATH, MULTI-STAGE FEED-FORWARD OPERATIONAL AMPLIFIER CIRCUIT

(75) Inventor: Hajime Shibata, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/463,231

(22) Filed: May 8, 2009

(65) Prior Publication Data

US 2010/0283545 A1 Nov. 11, 2010

(51) Int. Cl.
*H03F 3/68* (2006.01)
(52) U.S. Cl. ............ 330/124 R; 330/310; 330/295
(58) Field of Classification Search .......... 330/310, 330/98, 133, 150, 295, 124 R, 286, 53, 84
See application file for complete search history.

(56) References Cited

U.S. PATENT DOCUMENTS

| | | | |
|---|---|---|---|
| 6,002,299 | A | 12/1999 | Thomsen |
| 6,184,748 | B1 * | 2/2001 | Rao et al. .......... 327/552 |
| 7,173,485 | B2 * | 2/2007 | Nagai ............ 330/107 |
| 7,301,395 | B2 * | 11/2007 | Mobbs .......... 330/124 R |
| 7,365,668 | B2 | 4/2008 | Mitteregger |

OTHER PUBLICATIONS

Mitteregger, Gerhard, et al., A 20-mW 640-MHz CMOS Continuous-Time ΔΣ ADC With 20-MHz Signal Bandwidth, 80-dB Dynamic Range and 12-bit ENOB, IEEE Journal of Solid-State Circuits, Dec. 2006, pp. 2641-2649, vol. 41, No. 12.
You, Fan, et al., Multistage Amplifier Topologies with Nested Gm-C Compensation, IEEE Journal of Solid-State Circuits, Dec. 1997 pp. 2000-2011, vol. 32, No. 12.

* cited by examiner

*Primary Examiner* — Hieu Nguyen
(74) *Attorney, Agent, or Firm* — Kenyon & Kenyon LLP

(57) ABSTRACT

An embodiment of an amplifier circuit includes a plurality of amplifiers connected between input and output terminals to form at least partially parallel amplification paths between the terminals. A first plurality of the amplification paths include series-connected pluralities of the amplifiers and share a common first series-connected amplifier, and a second plurality of the amplification paths have different first amplifiers. Optionally, a third plurality of the amplification paths include series-connected pluralities of the amplifiers and share a common last series-connected amplifier, and a fourth plurality of the amplification paths have different last amplifiers. Alternatively, a first plurality of the amplification paths include series-connected pluralities of the amplifiers and share a common last series-connected amplifier, and a second plurality of the amplification paths have different last amplifiers. In the alternative embodiment, optionally a third plurality of the amplification paths include series-connected pluralities of the amplifiers and share a common first series-connected amplifier, and a fourth plurality of the amplification paths have different first amplifiers.

31 Claims, 8 Drawing Sheets

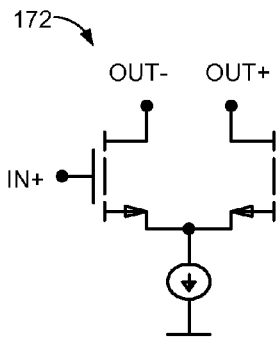
FIG. 6A
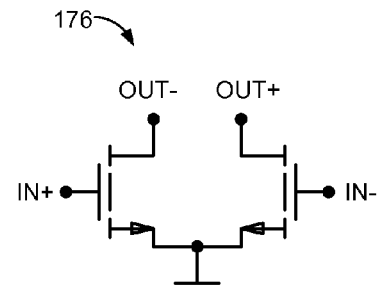
FIG. 6B
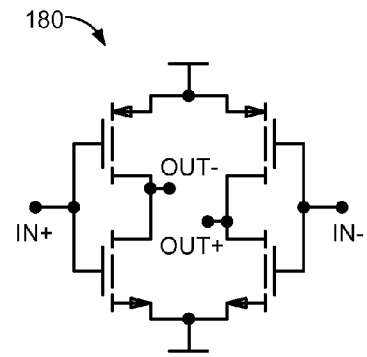
FIG. 6C
FIG. 6D
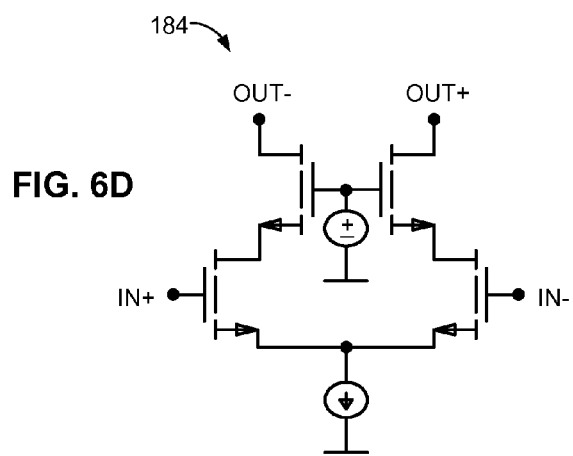
FIG. 6E
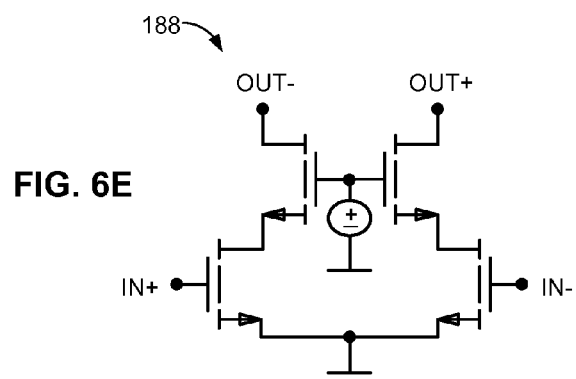
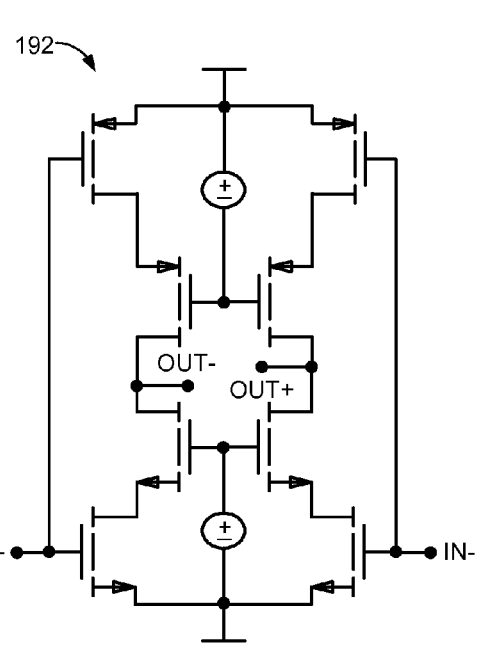
FIG. 6F

US 8,102,206 B2

MULTI-PATH, MULTI-STAGE FEED-FORWARD OPERATIONAL AMPLIFIER CIRCUIT

BACKGROUND INFORMATION

Many application circuits utilize amplifiers to achieve desired functionality. Analog-to-digital converters (ADCs), for example, typically require amplification during the conversion of an analog signal to a digital signal. Application circuits may also utilize an amplifier (e.g., an operational amplifier) arranged in a feedback configuration to realize a predetermined gain as a function of frequency. FIG. 1A depicts an exemplary of an operational amplifier 10 in a feedback configuration. A ΔΣ ADC, e.g., typically utilizes a feedback amplifier, having a specified predetermined frequency response, to achieve performance goals such as noise shaping. Other application circuits, such as a tuner or a general amplifier, can also require amplification having a predetermined frequency response. An operational amplifier typically needs to be at least conditionally stable, as arranged in a feedback configuration, to achieve a predetermined frequency response.

One operational-amplifier architecture that can be used includes a two-stage operational amplifier having Miller compensation. However, such a two-stage operational amplifier may not provide enough loop gain in low frequencies. Moreover, extending the Miller-compensated operational amplifier architecture structure to more than two stages can typically only achieve about −6 dB/octave of loop gain at frequencies leading up to the unity gain frequency.

An operational-amplifier architecture that can be used to provide higher loop gain includes embodiments of multi-path, multi-stage feed-forward operational amplifier circuits. FIG. 1B depicts an exemplary embodiment of a multi-path, multi-stage feed-forward operational amplifier circuit 20. The depicted amplifier circuit 20 includes a plurality of distinct amplification paths 24, each amplification path 24 including a number of amplifiers and capacitors and being considered to be of a certain order based on its number of amplifiers. A first-order amplification path 24a includes a single amplifier 28a, a second-order amplification path 24b includes two amplifiers 28b, 28c (along with a capacitor C1a), a third-order amplification path 24c contains three amplifiers 28d, 28e, 28f (along with capacitors C1b, C1c), and a fourth-order amplification path 24d includes four amplifiers 28g, 28h, 28i, 28j (along with capacitors C1d, C1e, C1f). The amplifiers are depicted as being transconductance amplifiers (transconductors), i.e., voltage-to-current amplifiers. However, it is also possible to use voltage-to-voltage amplifiers or current-to-current amplifiers. The depicted signal paths can be either single-ended or differential signal paths.

One advantage of a multi-path, multi-stage feed-forward amplifier architecture is that it typically provides a steeper loop gain below unity-gain frequency, e.g., greater than −6 dB/octave, than does a multi-stage Miller-compensated architecture. Moreover, each amplification path can be individually tailored to contribute a different frequency response. Relatively lower-order amplification paths can typically be used to implement a lower DC-gain, higher-bandwidth frequency response, whereas higher-order amplification paths can typically be used to implement a higher DC-gain, lower-bandwidth frequency response. The selective combination of such different frequency responses can typically implement much higher loop gain at low frequencies than Miller-compensated operational amplifier architectures, and provide improved closed-loop accuracy and lower distortion. However, a steeper loop gain can also mean that the operational amplifier is only conditionally stable, i.e., stable only within a certain range of feedback factors.

One problem with the embodiment of the multi-path, multi-stage amplifier circuit 20 depicted in FIG. 1B, however, is that it can be regarded as inefficient from the context of both size and power. The large number of independent amplifiers 28a-28j requires both a large chip area to implement and a large power to operate. Thus, there exists a need for a multi-path, multi-stage amplifier circuit which is more efficient in size and power use, while also achieving good noise and output-current driving performance.

BRIEF DESCRIPTION OF THE DRAWINGS

So that features of the present invention can be understood, a number of drawings are described below. However, that the appended drawings illustrate only particular embodiments of the invention and are therefore not to be considered limiting of its scope, for the invention may encompass other equally effective embodiments.

FIGS. 6A, 6B, 6C, 6D, 6E and 6F are circuit schematics depicting embodiments of amplification transistor configurations that can be used to implement amplifiers of multi-path, multi-stage feed-forward amplifier circuits described herein.

DETAILED DESCRIPTION OF EXAMPLE EMBODIMENTS

An embodiment of an amplifier circuit includes a plurality of amplifiers connected between input and output terminals to form at least partially parallel amplification paths between the input and output terminals, wherein a first plurality of the amplification paths include series-connected pluralities of the amplifiers and share a common first series-connected amplifier, and a second plurality of the amplification paths have different first amplifiers. Optionally, a third plurality of the amplification paths include series-connected pluralities of the amplifiers and share a common last series-connected amplifier, and a fourth plurality of the amplification paths have different last amplifiers.

Another embodiment of the amplifier circuit includes a plurality of amplifiers connected between input and output terminals to form at least partially parallel amplification paths between the input and output terminals, wherein a first plurality of the amplification paths include series-connected pluralities of the amplifiers and share a common last series-connected amplifier, and a second plurality of the amplification paths have different last amplifiers. Optionally, a third plurality of the amplification paths include series-connected pluralities of the amplifiers and share a common first series-connected amplifier, and a fourth plurality of the amplification paths have different first amplifiers.

Figure 1A:
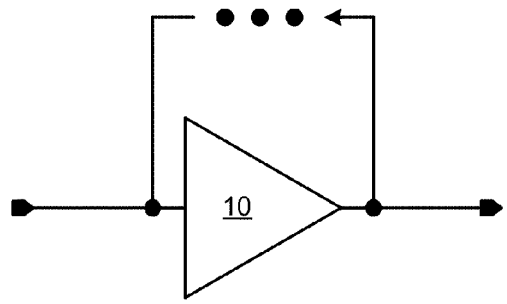
FIG. 1A is a circuit schematic depicting an embodiment of an operational amplifier in a feedback configuration.
Figure 1B:
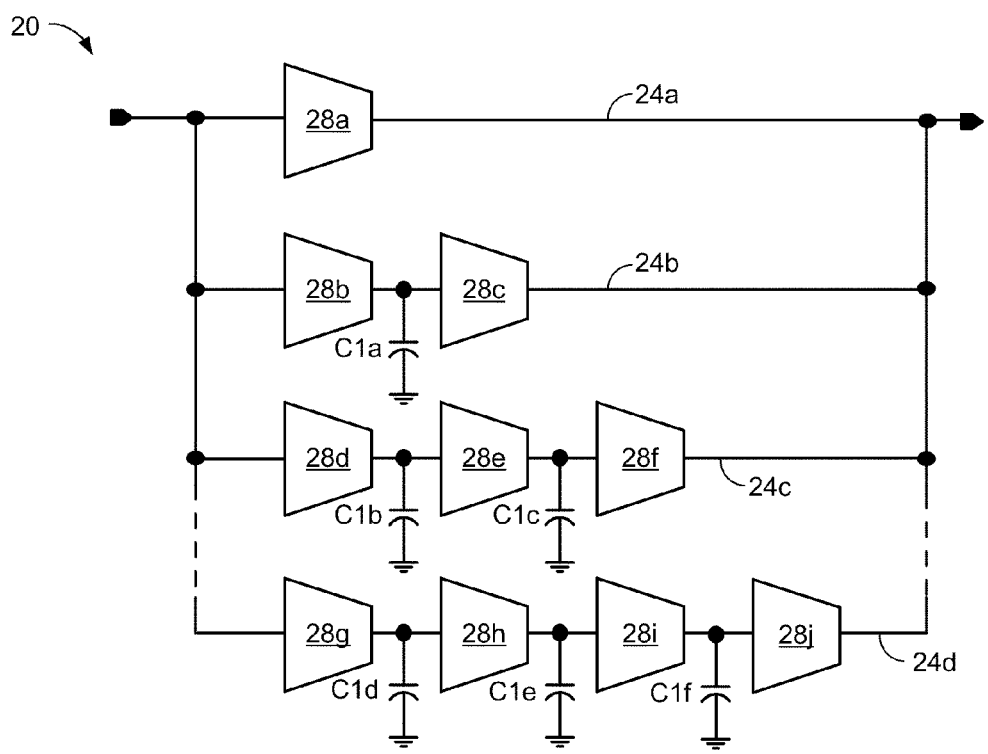
FIG. 1B is a circuit schematic depicting an embodiment of a multi-path, multi-stage feed-forward amplifier circuit.
Figure 2A:
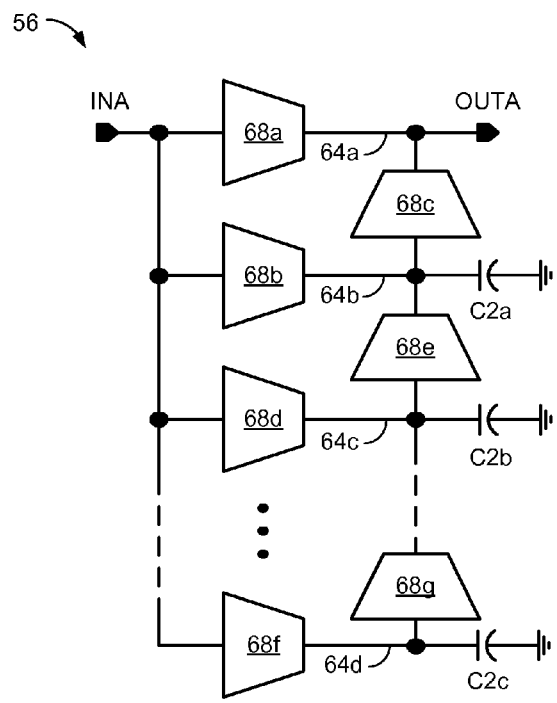
FIGS. 2A and 2B are circuit schematics depicting other embodiments of multi-path, multi-stage feed-forward amplifier circuits.
Figure 2B:
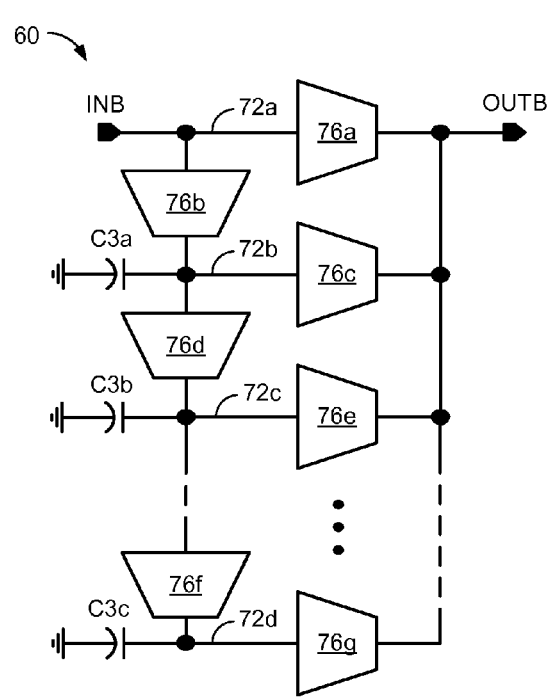

FIGS. 2A and 2B depict exemplary embodiments of multi-path, multi-stage feed-forward operational amplifier circuits 56, 60. The amplifier circuits 56, 60 include a plurality of at least partially parallel amplification paths of varying order, each including a number of amplifiers according to its order, arranged between an input terminal INA and an output terminal OUTA. In FIG. 2A, the amplifier circuit 56 includes a first-order amplification path 64a having a single amplifier 68a, a second-order amplification path 64b having two amplifiers (including second and third amplifiers 68b, 68c), a third-order amplification path 64c having three amplifiers (including fourth, fifth and the third amplifiers 68d, 68e, 68c), and (as depicted, without additional possible amplification paths added) a fourth-order amplification 64d path having four amplifiers (including a sixth, a seventh, the fifth and the third amplifiers 68f, 68g, 68e, 68c). Similarly, in FIG. 2B, the amplifier circuit 60 includes, arranged between input and output terminals INB, OUTB, a first-order amplification path 72a having a first amplifier 76a, a second-order amplification path 72b having second and third amplifiers 76b, 76c, a third-order amplification path 72c having the second, a fourth and a fifth amplifiers 76b, 76d, 76e, and a fourth-order amplification path having the second, the fourth, a sixth and a seventh amplifiers 76b, 76d, 76f, 76g. Each amplification path also includes compensation capacitors. In FIG. 2A, the second-order amplification path 64b includes capacitor C2a, the third-order amplification path 64c includes capacitors C2b and C2a, and the fourth-order amplification 64d includes capacitors C2c, C2b, and C2a. Similarly, in FIG. 2B, the amplification paths include capacitors C3a, C3b, and C3c. Taking into consideration a load capacitor (not shown) connected at the output terminals OUTA, OUTB, each depicted amplification path can thus include a number of capacitors also according to its order.

The amplifiers 68a-68g, 76a-76g of the amplifiers circuits 56, 60 of FIGS. 2A and 2B are depicted as being transconductance amplifiers (transconductors), i.e., voltage-to-current amplifiers. However, it is possible for any of the amplifier circuit embodiments discussed herein to be adapted to instead use voltage-to-voltage amplifiers or current-to-current amplifiers as the constituent amplifiers. As also is applicable for any of the amplifier circuits discussed herein, the amplifiers and signal paths depicted in FIGS. 2A and 2B can represent either single-ended or differential (or a combination of both) amplifiers and signal paths.

The amplifier circuits 56, 60 of FIGS. 2A and 2B may, however, be subject to some design conflicts between noise and output-current driving performance. In FIG. 2A, for example, the noise performance of the amplifier circuit 56 tends to be dominated by the noise performance of the first amplifier 68f of the highest-order amplification path 64d, whereas the last amplifier 68c in this highest-order amplification path 64d must typically supply the greatest amount of output current to drive a load (not shown). Thus, a tendency is to skew allocation of a power budget toward the first amplifier 68f in the highest-order amplification path 64d to achieve low noise, but this conflicts with a tendency to skew allocation of the power budget toward the last amplifier 68c in the highest-order amplification path 64d to achieve high output-current driving capability, which would naturally tend to lead to a smaller power allocation to the first amplifier 68f in the highest-order amplification path 64d.

In FIG. 2B, a similar situation occurs, with the tendency again being to skew allocation of a power budget toward the first amplifier 76b in the highest-order amplification path 72d to achieve low noise, and to skew allocation of the power budget toward the last amplifier 76g in the highest-order amplification path 72d to achieve high output-current driving capability, but which naturally tends to suggest a smaller power allocation to the first amplifier 76b in the highest-order amplification path 72d, again potentially resulting in a design conflict.

Figure 3A:
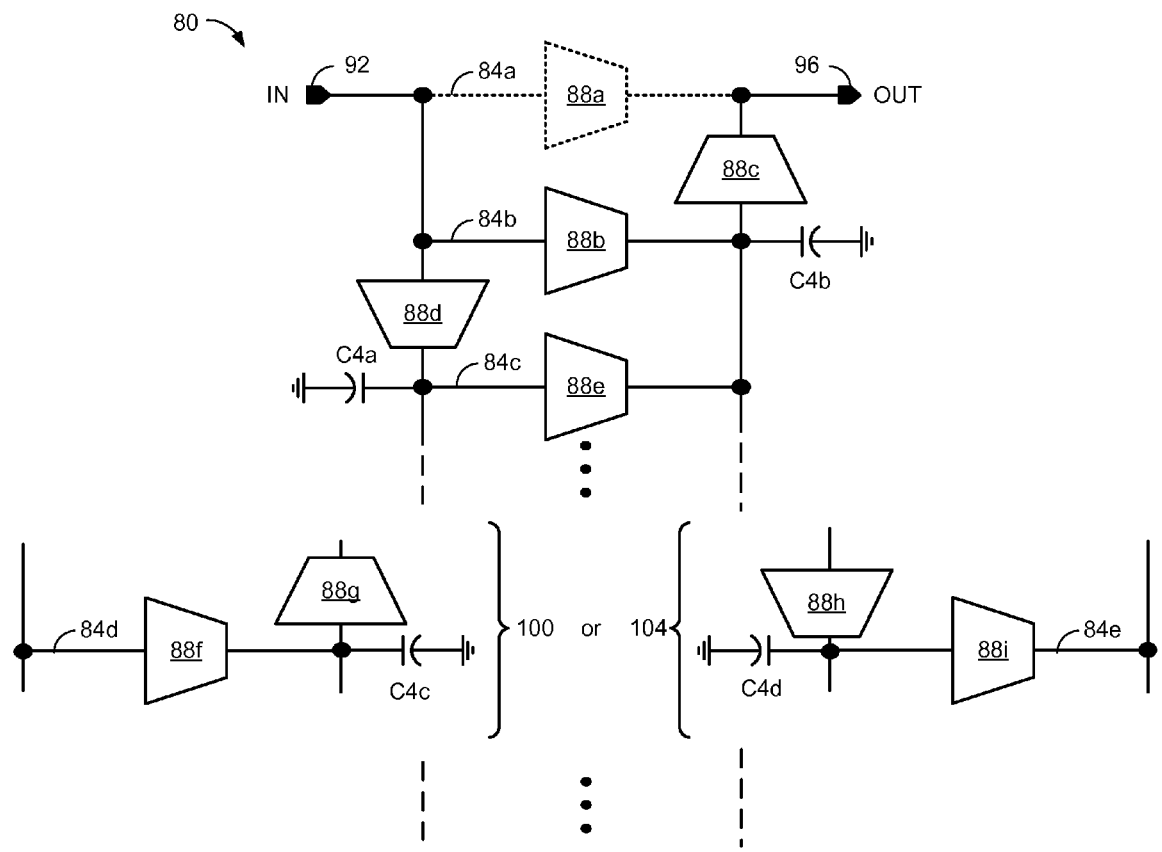
FIGS. 3A and 3B are circuit schematics depicting further embodiments of multi-path, multi-stage feed-forward amplifier circuits.
Figure 3B:
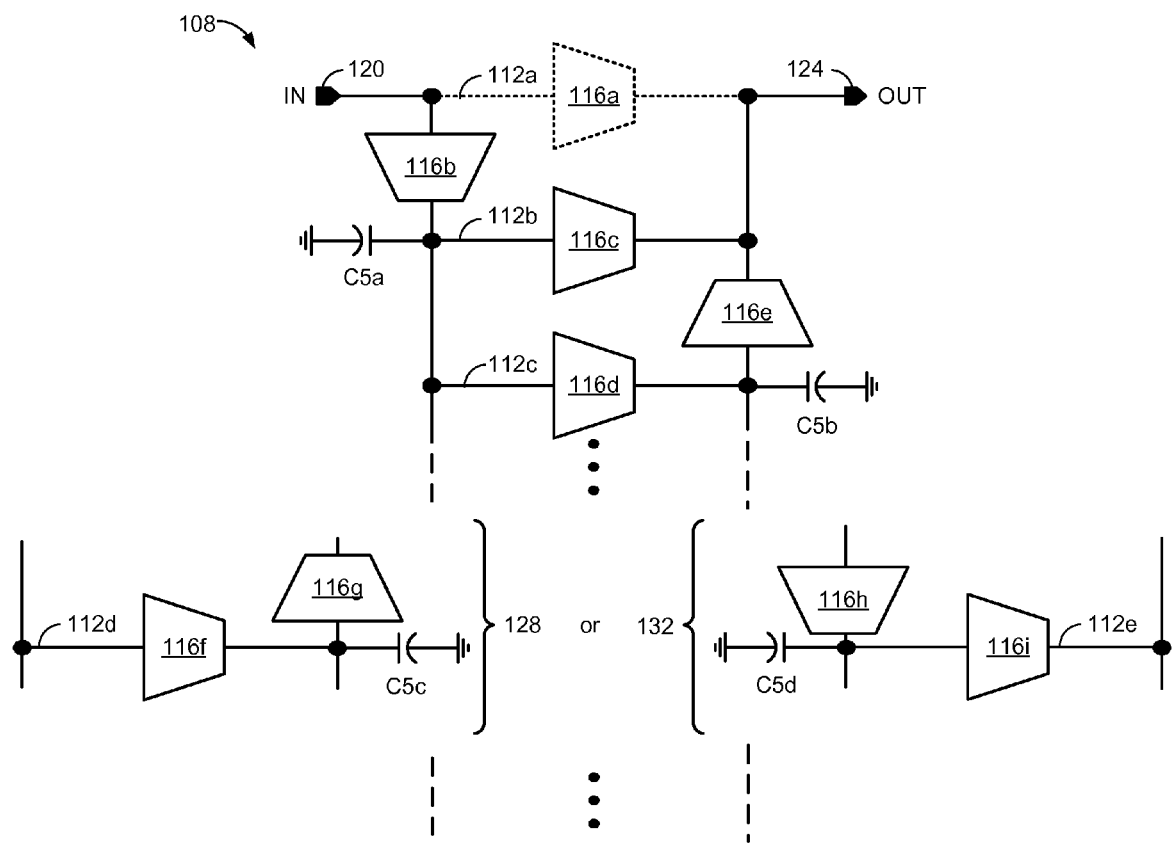

FIGS. 3A and 3B depict embodiments of a multi-path, multi-stage feed-forward operational amplifier circuits 80, 108 that reduce the design conflict embodied by competing and conflicting tendencies to skew allocation of a power budget to the first and last amplifiers in the highest-order amplification paths to achieve good noise and output-current driving capabilities. In FIG. 3A, the amplifier circuit 80 includes a plurality of successively higher-order amplification paths 84 (e.g., 84a, 84b, 84c, etc.). An optional first-order amplification path 84a includes a first amplifier 88a connected between an input terminal 92 and an output terminal 96 of the amplifier circuit 80. A second-order amplification path 84b includes two amplification stages, including a second amplifier 88b and a third amplifier 88c connected between the input and output terminals 92, 96 of the amplifier circuit 80. A third-order amplification path includes three amplification stages, including a fourth amplifier 88d, a fifth amplifier 88e and the third amplifier 88c connected between the input and output terminals 92, 96. In FIG. 3A, the amplifier circuit 80 also includes capacitors C4a and C4b, which can be either formed as distinct capacitors or effectively implemented as parasitic capacitances.

Beyond the third-order amplification path 84c, additional increasingly higher-order amplification paths can be added to the amplifier circuit by adding either a right- or left-form circuit component 100, 104. The right- and left-form components 100, 104 are depicted as capable of being added in the alternative in FIG. 3A, with the right-form component 100 depicted on the left and the left-form component 104 depicted on the right, as additional "layers" to the "stack" of amplifiers 88 making up the first- through third-order amplification paths 84a, 84b, 84c. Any number of additional right- or left-form components 100, 104 can be added to the amplifier circuit 80 to form successively higher-order amplification paths. The right-form component 100 includes sixth amplifier 88f, seventh amplifier 88g, and capacitor C4c, and the left-form component includes eighth amplifier 88h, ninth amplifier 88i, and capacitor C4d. The capacitances C4c and C4d can again be either formed as distinct capacitors or effectively implemented as parasitic capacitances.

In one example, a fourth-order amplification path 84d can be formed by adding a right-form component 100, and such a fourth-order amplification path 84d would include the fourth amplifier 88d, the sixth amplifier 88f, the seventh amplifier 88g, and the third amplifier 88c connected between the input and output terminals 92, 96. A fifth-order amplification path (not shown) could then be formed by again adding a right-form or a left-form component 100, 104, and so on to form successively higher-order amplification paths. In another example, a fourth-order amplification path 84e can be formed by adding a left-form component 104, and such a fourth-order amplification path 84e would include the fourth amplifier 88d, the eight amplifier 88h, the ninth amplifier 88i, and the third amplifier 88c connected between the input and output terminals 92, 96. A fifth-order amplification path (not shown) could then formed by adding a right-form or a left-form component 100, 104, and so on to form successively higher-order amplification paths. Structural differences can be introduced into the architecture by selecting different successive combinations of added right-form and left-form components 100, 104 to form higher-order amplification paths. These structural differences, the benefits of which are discussed in greater detail below, are related to the structural difference that has already been introduced into the architecture of the first- through third-order amplification paths 84a, 84b, 84c of FIG. 3A in comparison to the corresponding first- through third-order amplification paths 64a, 64b, 64c, 72a, 72b, 72c of FIGS. 2A and 2B. Note that the formation of the second- and third-order amplification paths 84b, 84c of the amplifier circuit 80 of FIG. 3A can also be considered as adding first a right-form component 100 in parallel with the first amplifier 88a connected between the input and output terminals 92, 96 to form the second-order path 84b, and then adding a left-form component 104 below that to form the third-order amplification path 84c.

In FIG. 3B, the multi-path, multi-stage feed-forward operational amplifier circuit 108 also has a plurality of successively higher-order parallel amplification paths 112. An optional first-order amplification 112a path includes a first amplifier 116a connected between an input terminal 120 and an output terminal 124. The structural difference between the embodiments of FIGS. 3A and 3B can then be explained, from one perspective, as instead of successively adding right- and then left-form components 100, 104 to form the second- and third-order amplification paths 84b, 84c, left- and then right-form components 132, 128 are added in parallel with the first amplifier 116a to form second- and third-order amplification paths 112b, 112c. Thus, in FIG. 3B, the second-order amplification path 112b includes a second amplifier 116b and a third amplifier 116c connected between the input and output terminals 120, 124, and the third-order amplification path 112c includes the second amplifier 116b, a fourth amplifier 116d and a fifth amplifier 116e connected between the input and output terminals 120, 124. The amplifier circuit 108 also includes capacitors C5a and C5b. Furthermore, as with the embodiment of FIG. 3A, in FIG. 3B successive additional higher-order amplification paths 112d, 112e can be formed by successively adding either right-form or left-form components 128, 132 to the depicted amplifier stack below the third-order amplification path 112c. The right-form component 100 includes a sixth amplifier 116f, a seventh amplifier 116g, and a capacitor C5c, and the left-form component includes an eighth amplifier 116h, a ninth amplifier 116i, and a capacitor C5d. The capacitances C5a, C5b, C5c and C5d can again be either formed as distinct capacitors or effectively implemented as parasitic capacitances.

Note that, as with the amplifier circuits 56, 60 of FIGS. 2A and 2B, the amplifier circuits 80, 108 of FIGS. 3A and 3B are depicted as including transconductance amplifiers, but, alternatively, the amplifier circuits 80, 108 can be adapted to instead use voltage-to-voltage or current-to-current amplifiers.

In embodiments of the amplifier circuits 80, 108 of FIGS. 3A and 3B, the plurality of at least partially parallel amplification paths of varying order can each including a number of amplifiers according to its order. Additionally, taking into consideration a load capacitor (not shown) connected at the output terminals OUT, each depicted amplification path can also optionally include a number of capacitors according to its order. The amplifier circuits 80, 108 of FIGS. 3A and 3B can achieve high frequency loop gains having a steepness increasing according to its increasing order. In exemplary embodiments, this can including high frequency loop gain slopes of at least −18 dB/octave for a third order circuit, at least −24 dB/octave for a fourth order circuit, at least −30 dB/octave for a fifth order circuit, etc.

Figure 4:
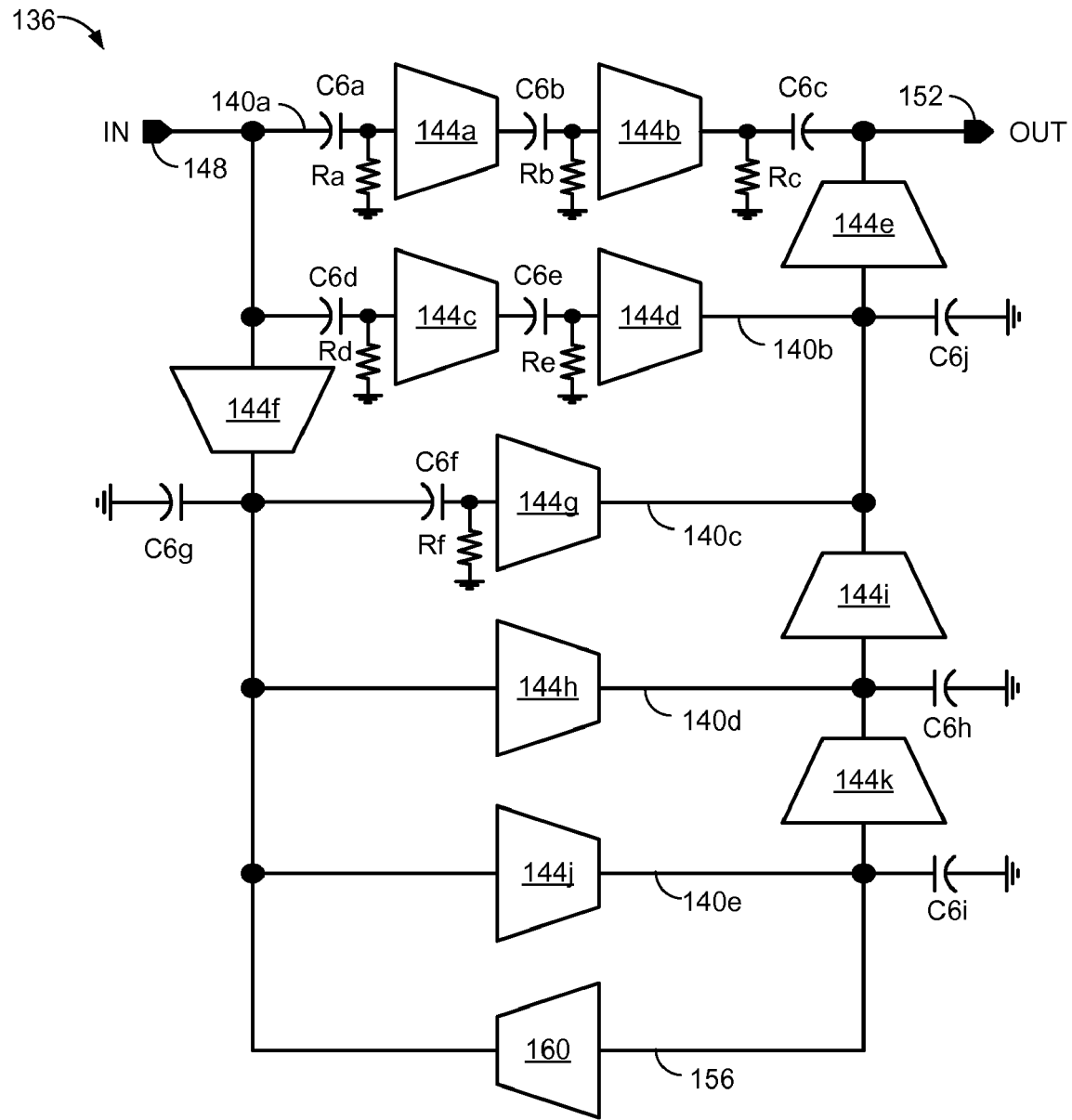
FIG. 4 is a circuit schematic depicting an embodiment of a fifth-order amplifier circuit constructed according to the architecture depicted in FIG. 3A.

FIG. 4 depicts one embodiment of a fifth-order amplifier circuit 136 formed according to the architecture of FIG. 3A. In FIG. 4, firstly note that an amplifier corresponding to the first amplifier 88a of FIG. 3A has been implemented as two sub-amplifiers 144a, 144b, including an input stage 144a and an output stage 144b, that collectively can be regarded as equivalent to the first amplifier 88a of FIG. 3A. Note also that an amplifier corresponding to the second amplifier 88b of FIG. 3A has also been implemented as two sub-amplifiers 144c, 144d, including an input stage 144c and an output stage 144d, that collectively can be regarded as equivalent to the second amplifier 88b of FIG. 3A. Thus, a first-order amplification path 140a in FIG. 4 includes the first input and output stages 144a, 144b connected between input and output terminals 148, 152. A second-order amplification path 140b includes the second input and output stages 144c, 144d and a third amplifier 144e connected between the input and output terminals 148, 152. A third-order amplification path 140c includes a fourth amplifier 144f, a fifth amplifier 144g, and the third amplifier 144e. Fourth- and fifth-order amplification paths 140d, 140e are formed by adding two right-form components in parallel with the fifth amplifier 144g of the third-order amplification path 140c. Thus, the fourth-order amplification path 140d includes the fourth amplifier 144f, a sixth amplifier 144h, a seventh amplifier 144i, and the third amplifier 144e. The fifth-order amplification path 140e includes the fourth amplifier 144f, an eight amplifier 144j, a ninth amplifier 144k, the seventh amplifier 144i, and the third amplifier 144e. In FIG. 4, the amplifier circuit 136 also includes capacitors C6a, C6b, C6c, C6d, C6e, C6f, C6g, C6h, C6i, and C6j, and resistors Ra, Rb, Rc, Rd, Re, and Rf.

The architecture embodied by the amplifier circuits 80, 136 of FIGS. 3A and 4 provides several benefits in comparison to the architecture embodied by the amplifier circuits 56, 60 of FIGS. 2A and 2B. First, because the noise performance of the amplifier circuits 80, 136 is dominated by the noise performance of the highest-order amplification path 84d/e, 140e, and to some extent by the other higher-order amplification paths, the sharing of the first amplifier 88d, 144f by a plurality of the highest-order amplification paths of the amplifier circuits 80, 136 of FIGS. 3A and 4 allows efficient power delivery to this noise-critical amplifier 88d, 144f. Second, because most of the output current (at least for selected operational frequencies) is typically supplied by the last amplifier 88c, 144e in the highest-order amplification path 84d/e, 140e, and to some extent by the last amplifiers in other higher-order amplification paths, the summing of several of the lower-order stages (e.g., 88b, 88e, 144d, 144g) at the same connection point to the last amplifier 88c, 144e of the highest-order stage 84d/e, 140e allows for this last amplifier 88c, 144e to be provided with sufficient output-current driving capability (i.e., power level) while at the same time allowing for more efficient scaling of the preceding amplifiers (e.g., 88g/i, 88f/h, 144i, 144k, 144j) of the highest-order amplification stage 84d/e, 140e. Similar benefits are likewise provided by the architecture embodied in the amplifier circuit 108 of FIG. 3B in comparison to the architecture embodied in the amplifier circuits 56, 60 of FIGS. 2A and 2B. The difference between the benefits provided by the architectures of FIGS. 3A and 3B can be considered as providing different relative degrees of these noise-related and output-current-driving-capability-related benefits.

Figure 5A:
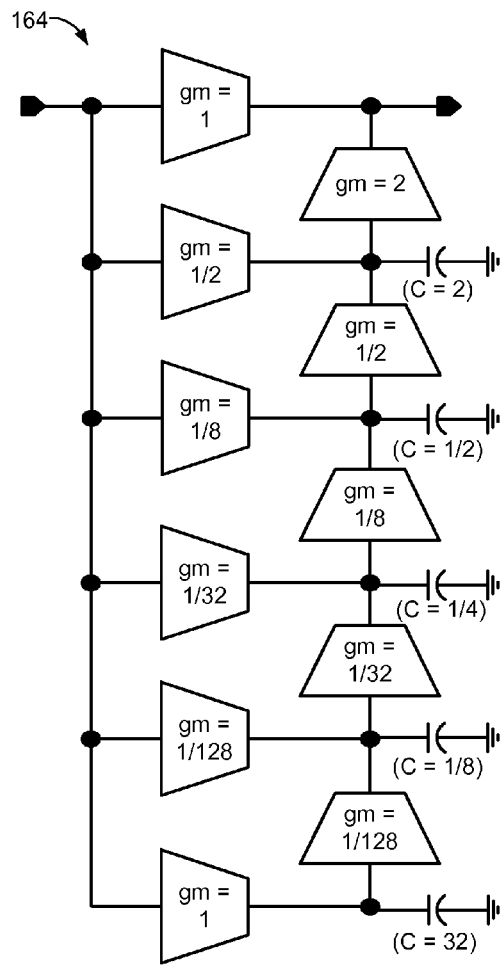
FIGS. 5A, 5B and 5C are circuit schematics depicting embodiments of sixth-order amplifier circuits constructed according to the architectures depicted in FIGS. 2A, 2B and 3A, respectively.
Figure 5B:
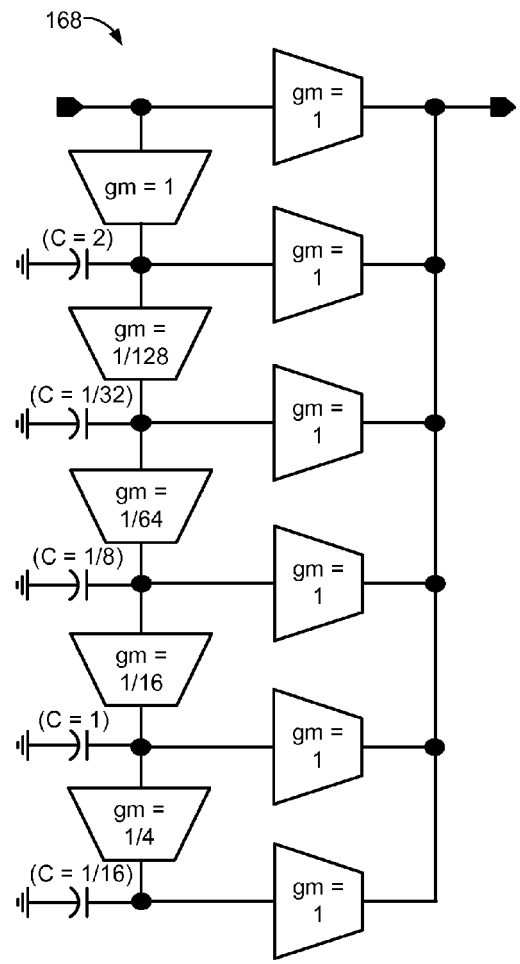
Figure 5C:
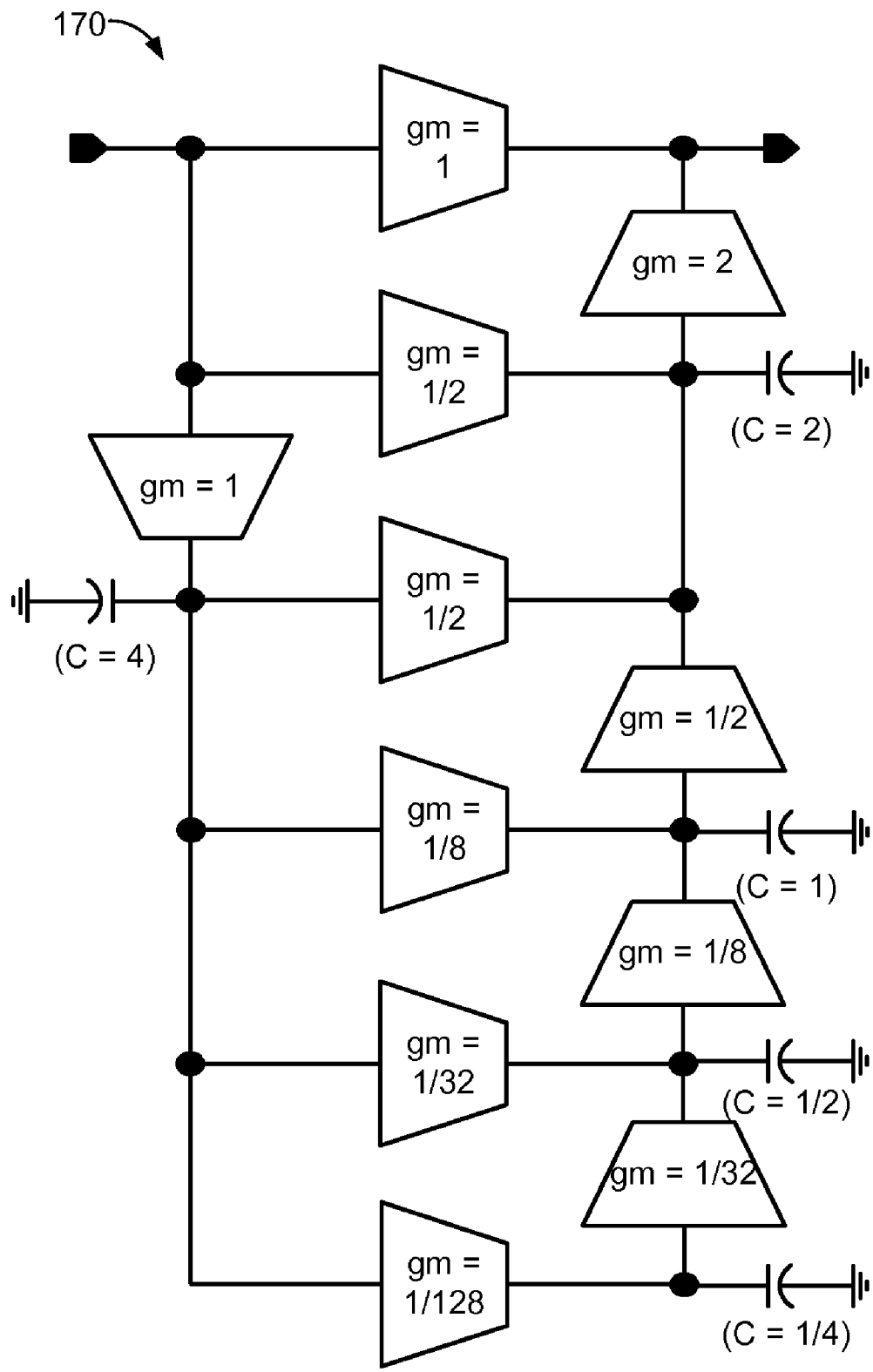

The benefits of the architectures embodied by the amplifier circuits 80, 108 8 of FIGS. 3A (and 4) and 3B can be alternatively be considered, in comparison to the architectures embodied by the amplifier circuits 56, 60 of FIGS. 2A and 2B, from the perspective of design implications resulting from attempting to achieve certain performance levels with both architectures. FIGS. 5A, 5B and 5C depict exemplary embodiments of amplifier circuits 164, 168, and 170 designed utilizing the architectures of FIGS. 2A, 2B, and 3A, respectively. In each of FIGS. 5A, 5B, and 5C, the amplifier circuits 164, 168, 170 have been designed to achieve the same or substantially same frequency response characteristics. Also, in each case, the same or substantially same amount of power has been supplied in both amplifier circuits to the corresponding last amplifiers in the highest-order amplification stages as well to the corresponding first amplifiers in the highest-order amplification stages.

In each case, a number representative of the relative amount of power supplied to each amplifier is indicated in parenthesis as a label for that amplifier. This number is proportional not only to the power supplied to the particular amplifier, but also the size and amount of current amplification (i.e., transconductance) of the particular amplifier. Thus, since all three circuits 164, 168, 170 have been designed to provide the same or substantially same frequency responses and output-current driving capabilities, the relative benefits of the amplifier circuit 170 of FIG. 5C (embodying the architecture of FIG. 3A) in comparison to that of FIGS. 5A and 5B (embodying the architectures of FIGS. 2A and 2B) can be understood from the perspective of the degree of traditionally-burdensome design choices necessary to achieve similar performance. In the case of FIGS. 5A, 5B, and 5C, this manifests in the size of capacitances that must be chosen to implement the same or substantially same frequency response and output-current driving capability for each architecture. (The role of capacitors in the architectures can be understood from the perspective that each of the amplifier circuits 164, 168, 170 of FIGS. 5A, 5B, and 5C can be considered as a Gm-C amplifier or filter, which can be characterized by transconductance and capacitance values.) In FIGS. 5A, 5B, and 5C, the relative representative size of various capacitors that can be used to achieve the same or substantially same performance in each architecture are depicted in parenthesis next to individual capacitors. For the amplifier circuit 164 of FIG. 5A to deliver a representative total transconductance value of about 5.33, it possesses a representative total capacitance value of about 34.9, for the amplifier circuit 168 of FIG. 5B to deliver a representative total transconductance value of about 8.33, it possesses a representative total capacitance value of about 19.2, and for the amplifier circuit 170 of FIG. 5C to deliver a representative total transconductance value of about 5.82, it possesses a representative total capacitance value of about 7.75.

Thus, the amplifier circuit 170 of FIG. 5C (embodying the architecture of FIG. 3A) is able to delivery the same or substantially same frequency-response performance for a much smaller representative total capacitance value than can the amplifier circuit 164 of FIG. 5A (embodying the architecture of FIG. 2A) or the amplifier circuit 168 of FIG. 5C (embodying the architecture of FIG. 2B), and roughly the same total transconductance as the amplifier circuit 164 of FIG. 5A. This reduced total capacitance value can translate to reduced chip area and concordant cost savings for production of the amplifier circuit 170 of FIG. 5C in comparison to that of FIGS. 5A and 5B.

Returning to FIG. 4, the depicted embodiment also includes a positive feedback path 156 including a feedback amplifier 160 arranged in parallel with the eighth amplifier 144*j* of the fifth-order amplification path 140*e*. The positive feedback provides another degree of overall frequency-response selectability of the amplifier circuit 136, and can be used to maintain high loop gain below the unity-gain frequency of the amplifier circuit 136. In exemplary embodiments, the positive feedback implemented by the feedback path 156 and feedback amplifier 160 enabled extension of a peak gain bandwidth from 500 GHz (without the positive feedback) to 600 GHz (with the positive feedback). Such specific numerical frequencies are only exemplary, however, and the effect of overall peak gain frequency extension can be achieved in conjunction with other embodiments that may consider operation in entirely different frequency ranges.

The embodiment of FIG. 4 also includes AC coupling capacitors C6*a*, C6*b*, C6*c*, C6*d*, C6*e*, and C6*f* configured in the lower-order amplification paths 140*a*, 140*b*, 140*c*. Other embodiments, however, can omit any of these capacitors, or have alternatively-configured capacitors in any of the amplification paths.

The various amplifiers of the plurality of amplification paths of amplifier circuits discussed herein can be of varied design. Each amplifier includes at least one amplification transistor configured to provide amplification to an input signal received at that amplifier to generate, or provide an intermediate signal that is used to generate, an output signal of that amplifier.

FIGS. 6A, 6B, 6C, 6D, 6E, and 6F depict exemplary embodiments of amplification transistor configurations 172, 176, 180, 184, 188, 192 that can be used to implement the amplifiers of any of the amplifier circuits discussed herein. FIG. 6A depicts a differential pair 172 of NMOS transistors, having gates connected to positive and negative input terminals, drains connected to positive and negative output terminals, and sources connected to a current source (which can be implemented using conventional current-source transistor configurations). FIG. 6B depicts a pseudo differential pair 176 of NMOS transistors, having gates connected to positive and negative input terminals, drains connected to positive and negative output terminals, and sources connected to a fixed voltage. Note that, although both FIGS. 6A and 6B depict NMOS amplification transistor configurations 172, 176, corresponding PMOS versions of the configurations 172, 176 of both FIGS. 6A and 6B can be formed by substituting PMOS transistors for the depicted NMOS transistors. Additionally, the transistor configurations 172, 176 can be modified to form corresponding common-source single transistor configurations by including only one of the two depicted transistors. FIG. 6C depicts complementary pseudo differential pairs 180 of NMOS and PMOS transistors, having gates connected to positive and negative input terminals, drains connected to positive and negative output terminals, and sources connected to fixed voltage sources. Optionally, gates of NMOS and PMOS transistors directly connected together in FIG. 6C can instead be separated by voltage sources or AC coupling capacitors. FIG. 6D depicts a cascode-configured differential pair 184, in which common-gate transistors are connected between the output terminals and the drains of a differential pair. FIG. 6E depicts a cascode-configured pseudo differential pair 188, in which common-gate transistors are connected between the output terminals and drains of a pseudo differential pair. FIG. 6F depicts a cascode-configured complimentary pseudo differential pair 192, in which common-gate transistors are connected between the output terminals and drains of a complimentary pseudo differential pair.

As discussed above, any of the multi-path, multi-stage amplifier circuits discussed herein can be implemented as fully differential (i.e., having differential signal paths throughout), fully single-ended (i.e., having single-ended signal paths throughout), or partially-differential and partiallysingle-ended (i.e., having both differential and single-ended paths variously throughout). The amplification transistor configurations 172, 176, 180, 184, 188, 192 of FIGS. 6A, 6B, 6C, 6D, 6E, and 6F are depicted as having differential inputs and differential outputs, and thus can be used to implement fully differential embodiments. However, the configurations 172, 176, 180, 184, 188, 192 of FIGS. 6A, 6B, 6C, 6D, 6E, and 6F can also be used to implement both fully single-ended embodiments as well as partially-differential, partially-single-ended embodiments. To implement a fully single-ended embodiment, one input terminal can be connected to a fixed voltage, and the output can be taken from a single one of the output terminals, with or without the other output terminal having its signal referred to such an output terminal. To implement a partially-differential, partially-single-ended embodiment, depending on whether the input or the output is single-ended or differential, one input can be connected to a fixed voltage, and the output can be taken from both output terminals, or both inputs can be used and the output taken from a single one of the output terminals (with or without the other output terminal having its signal referred to the utilized output terminal).

To implement embodiments of the amplifiers of any of the amplifier circuits discussed herein, the amplification transistor configurations 172, 176, 180, 184, 188, 192 of FIGS. 6A, 6B, 6C, 6D, 6E, and 6F can be supplemented by further circuitry, including common-mode circuitry configured to control DC voltage levels at various amplifier circuit nodes, active loads (i.e., transistor configurations arranged to operate as loads at, e.g., the output terminals of the amplification transistors), current sources (i.e., transistor configurations arranged to deliver predetermined currents to, e.g., the output terminals of the amplification transistors), among other circuit components. Furthermore, the amplification transistor configurations 172, 176, 180, 184, 188, 192 of FIGS. 6A, 6B, 6C, 6D, 6E, and 6F can be used to implement any of transconductors, voltage-to-voltage amplifiers, or current-to-current amplifiers, as particular embodiments of a multi-path, multi-stage amplifier circuit may require.

Each amplifier includes at least one amplification transistor configuration, and thus each amplification path includes at least a number of amplification transistor configurations matching its order. Thus, for example, a first-order amplification path includes at least one amplification transistor configuration, a second-order amplification path includes at least two amplification transistor configurations, a third-order amplification path includes at least three amplification transistor configurations, and so on, as the order of the amplification path increases. Optionally, however, any particular amplification path can include more than the number of amplification path transistor configurations matching its order. For example, in the embodiment of FIG. 4, both the first input stage 144a and the first output stage 144b of the first amplification path 140a can include an amplification transistor configuration. Likewise, in FIG. 4, the second input stage 144c and the second output stage 144d of the second amplification path 140b can also each include an amplification transistor configuration. Thus, in the embodiment of FIG. 4, the first-order amplification path 140a can optionally include at least two amplification transistor configurations, and the second-order amplification path 140b can optionally include at least three amplification transistor configurations.

In an exemplary embodiment, the amplifier circuit 136 depicted in FIG. 4 can be implemented using the amplification transistor configurations 172, 180, 184, 192 of FIGS. 6A, 6C, 6D, and 6F as follows: the first input stage 144a including an NMOS differential pair 172; the first output stage 144b including complementary NMOS and PMOS pseudo differential pairs 180; the second input stage 144c including an NMOS differential pair 172; the second output stage 144d including complementary NMOS and PMOS pseudo differential pairs 180; the third amplifier including cascode-configured complementary NMOS and PMOS pseudo differential pairs 192; the fourth amplifier 144f including an NMOS differential pair 172 and a PMOS differential pair 172; the fifth amplifier 144g including cascode-configured complementary NMOS and PMOS pseudo differential pairs 192; the sixth amplifier 144h including cascode-configured complementary NMOS and PMOS pseudo differential pairs 192; the seventh amplifier 144i including cascode-configured complementary NMOS and PMOS pseudo differential pairs 192; both the eighth and ninth amplifiers 144j, 144k including cascode-configured complementary NMOS and PMOS pseudo differential pairs 192; and the feedback amplifier 160 including cascode-configured PMOS differential pairs 184.

Other embodiments of a multi-path, multi-stage operational amplifier circuit are also possible. For example, aspects and components of various embodiments described herein can also be combined and mixed with each other to create new embodiments of the amplifier circuit.

What is claimed is:

1. An operational amplifier arranged in a feedback configuration, the operational amplifier comprising:
a plurality of amplifiers connected between input and output terminals of the operational amplifier to form a plurality of at least partially different amplification paths extending from the input terminal to the output terminal, each of the amplification paths including a respective subset of the plurality of amplifiers configured in series and having a respective first-in-order amplifier and a respective last-in-order amplifier,
wherein the first-in-order amplifier of at least a first and a second of the amplification paths is a same first common amplifier, and the first-in-order amplifier of at least a third of the amplification paths is different than the first common amplifier, and
wherein the last-in-order amplifier of the first and second amplification paths is a second common amplifier.

2. The operational amplifier of claim 1, wherein the last-in-order amplifier of the third amplification path is also the second common amplifier.

3. The operational amplifier of claim 1, wherein at least three of the amplification paths are electrically joined at a point immediately before their last-in-order amplifiers, and at least two of the amplification paths are electrically joined at a point immediately after their first-in-order amplifiers.

4. The operational amplifier of claim 1, wherein the amplification paths include a plurality of lower-order amplification paths and a plurality of higher-order amplification paths, the lower-order amplification paths including fewer amplifiers than the higher-order amplification paths, at least one of the lower-order amplification paths includes at least one of: an AC coupling capacitor between the output terminal and a last amplifier of that lower-order amplification path, or an AC coupling capacitor between the input terminal and a first amplifier of that lower-order amplification path.

5. The operational amplifier of claim 1, wherein each amplifier includes at least one amplification transistor configuration selected from the group consisting of a common-source transistor, a differential pair of transistors, a pseudo differential pair of transistors, and complementary pseudo differential pairs of transistors.

6. The operational amplifier of claim 5, wherein at least one of the plurality of amplifiers further includes a common-gate transistor cascode-connected with a transistor of the amplification transistor configuration.

7. The operational amplifier of claim 1, further comprising a positive feedback amplifier.

8. The operational amplifier of claim 1, wherein at least one amplification path includes at least four amplifiers connected in series.

9. The operational amplifier of claim 1, having a loop gain slope of at least −18 dB/octave over a portion of its frequency response lower than the unity-gain frequency of the loop gain.

10. The operational amplifier of claim 1, wherein the first and second common amplifiers have amplification gains at DC greater than or equal to that of all other amplifiers of the plurality of amplifiers.

11. The operational amplifier of claim 1, wherein the plurality of at least partially different amplification paths includes a fifth order amplification path.

12. The operational amplifier of claim 1, wherein the plurality of at least partially different amplification paths includes a first order amplification path.

13. An operational amplifier arranged in a feedback configuration, the operational amplifier comprising:
a plurality of amplifiers connected between input and output terminals of the operational amplifier to form a plurality of at least partially different amplification paths extending from the input terminal to the output terminal, each of the amplification paths including a respective subset of the plurality of amplifiers configured in series and having a respective first-in-order amplifier and a respective last-in-order amplifier,
wherein the last-in-order amplifier of at least a first and a second of the amplification paths is a same first common amplifier, and the last-in-order amplifier of at least a third of the amplification paths is different than the first common amplifier, and
wherein the first-in-order amplifier of the first and second amplification paths is a second common amplifier.

14. The operational amplifier of claim 13, wherein the first-in-order amplifier of the third amplification path is not the second common amplifier.

15. The operational amplifier of claim 13, wherein at least two of the amplification paths are electrically joined at a point immediately before their last-in-order amplifiers, and at least three of the amplification paths are electrically joined at a point immediately after their first-in-order amplifiers.

16. The operational amplifier of claim 13, wherein the amplification paths include a plurality of lower-order amplification paths and a plurality of higher-order amplification paths, the lower-order amplification paths including fewer amplifiers than the higher-order amplification paths, at least one of the lower-order amplification paths including at least one of: an AC coupling capacitor between the output terminal and a last amplifier of that lower-order amplification path, or an AC coupling capacitor between the input terminal and a first amplifier of that lower-order amplification path.

17. The operational amplifier of claim 13, wherein each amplifier includes at least one amplification transistor configuration selected from the group consisting of a common-source transistor, a differential pair of transistors, a pseudo differential pair of transistors, and complementary pseudo differential pairs of transistors.

18. The operational amplifier of claim 17, wherein at least one of the plurality of amplifiers further includes a common-gate transistor cascode-connected with a transistor of the amplification transistor configuration.

19. The operational amplifier of claim 13, further comprising a positive feedback amplifier.

20. The operational amplifier of claim 13, wherein at least one amplification path includes at least four amplifiers connected in series.

21. The operational amplifier circuit of claim 13, having a loop gain slope of at least −18 dB/octave over a portion of its frequency response lower than the unity-gain frequency of the loop gain.

22. The operational amplifier circuit of claim 13, wherein the first and second common amplifiers have amplification gains at DC greater than or equal to that of all other amplifiers of the plurality of amplifiers.

23. The operational amplifier circuit of claim 13, wherein the plurality of at least partially different amplification paths includes a fifth order amplification path.

24. The operational amplifier circuit of claim 13, wherein the plurality of at least partially different amplification paths includes a first order amplification path.

25. An operational amplifier arranged in a feedback configuration, the operational amplifier comprising:
a first and a second amplifier, connected in series in that order, defining a first amplification path that extends between an input terminal and an output terminal; and
a third, a fourth, and the second amplifier, connected in series in that order, defining a second amplification path that extends between the input and output terminals; and
the third, a fifth, a sixth, and the second amplifier, connected in series in that order, defining a third amplification path that extends between the input and output terminals.

26. The operational amplifier of claim 25, further comprising a seventh amplifier connected between the input and output terminals.

27. The operational amplifier of claim 25, wherein each amplifier includes at least one amplification transistor configuration selected from the group consisting of a common-source transistor, a differential pair of transistors, a pseudo differential pair of transistors, and complementary pseudo differential pairs of transistors.

28. The operational amplifier of claim 27, wherein at least one of the plurality of amplifiers further includes a common-gate transistor cascode-connected with a transistor of the amplification transistor configuration.

29. The operational amplifier of claim 25, further comprising a series connection of eighth and ninth amplifiers, the series connection connected in parallel with at least one of: the fifth amplifier or the sixth amplifier.

30. The operational amplifier of claim 25, further comprising a positive feedback amplifier.

31. An operational amplifier arranged in a feedback configuration, the operational amplifier comprising:
a first amplifier to receive an input from an input terminal and produce a first output;
a second amplifier to receive the input from the input terminal and produce a second output;
a plurality of third amplifiers connected at least partially in parallel and each to receive the first output from the first amplifier and to produce a plurality of third outputs; and
a fourth amplifier to receive the second output and a plurality of signals based on the third outputs and to produce a fourth output to an output terminal.

* * * * *